United States Patent [19]
Österberg

[11] Patent Number: 5,881,374
[45] Date of Patent: Mar. 9, 1999

[54] CIRCUITRY AND METHOD FOR DETECTING FREQUENCY DEVIATION CAUSED BY AGING OF AN OSCILLATOR

[75] Inventor: Jan Österberg, Sundbyberg, Sweden

[73] Assignee: Telefonaktiebolaget L M Ericsson (publ), Stockholm, Sweden

[21] Appl. No.: 792,665

[22] Filed: Jan. 31, 1997

[51] Int. Cl.$^6$ .............................. H03C 1/62; H03D 3/24
[52] U.S. Cl. ..................... 455/115; 455/183.1; 375/376
[58] Field of Search .................... 455/113, 115, 455/118, 119, 164.1, 164.2, 165.1, 182.2, 183.1, 260, 264, 316; 375/371, 373, 375, 376; 331/18, 23, 25

[56] References Cited

U.S. PATENT DOCUMENTS

| | | | |
|---|---|---|---|
| 3,165,698 | 1/1965 | Friend et al. | 325/148 |
| 3,231,820 | 1/1966 | Cayzac | 325/148 |
| 3,512,103 | 5/1970 | Berman | 331/2 |
| 3,550,006 | 12/1970 | Harner | 325/113 |
| 3,622,269 | 11/1971 | Osborne et al. | 325/63 |
| 3,733,551 | 5/1973 | Augenblick et al. | 325/105 |
| 4,009,449 | 2/1977 | Agans | 331/16 |
| 4,123,725 | 10/1978 | Davis | 331/8 |
| 4,131,861 | 12/1978 | Malaviya | 331/2 |
| 4,231,116 | 10/1980 | Sekiguchi et al. | 455/87 |
| 4,290,145 | 9/1981 | Saba et al. | 455/113 |
| 4,534,295 | 8/1985 | Gregory | 331/158 |
| 4,573,026 | 2/1986 | Curtis et al. | 332/18 |
| 4,633,510 | 12/1986 | Suzuki et al. | 455/69 |
| 4,710,970 | 12/1987 | Wu et al. | 455/113 |
| 4,794,622 | 12/1988 | Isaacman et al. | 375/71 |
| 4,839,613 | 6/1989 | Echols et al. | 331/69 |
| 5,027,429 | 6/1991 | Kojima | 455/113 |
| 5,063,357 | 11/1991 | Williams et al. | 331/49 |
| 5,113,416 | 5/1992 | Lindell | 375/97 |
| 5,343,169 | 8/1994 | Debaty | 331/17 |
| 5,392,005 | 2/1995 | Bortolini et al. | 331/44 |
| 5,552,749 | 9/1996 | Nowatski et al. | 331/14 |
| 5,559,842 | 9/1996 | Javitt | 375/376 |
| 5,570,066 | 10/1996 | Eberhardt et al. | 455/260 |

FOREIGN PATENT DOCUMENTS 0 483 090 A1   4/1992   European Pat. Off. .

OTHER PUBLICATIONS

D. Niethammer, "Netztaktversorgung NTV–2 mit hochstabiler und redundanter Taktregenerierung für digitale Fernmeldesysteme," *Telcom Report*, 8, (Mar. 1987), 180–185, (No Translation).

E.A. Munter, "Synchronized Clock for DMS–100 Family," *IEEE Transactions on Communications*, COM–28, (1980) 1276–1284.

PCT, Standard Search Report, May 7, 1998, File PCT/SE 98/000221.

*Primary Examiner*—Nguyen Vo
*Assistant Examiner*—Sam Bhattacharya
*Attorney, Agent, or Firm*—Jenkens & Gilchrist

[57] ABSTRACT

Apparatus, and associated method, for determining frequency deviation of an oscillator due to aging of the oscillator. Frequency deviation of a clock signal generated by the oscillator relative to a reference clock signal is determined, and the component of the frequency deviation due to aging of the oscillator is estimated from the total value. The determined value of frequency deviation can be utilized in a feedback arrangement to tune the oscillator to counteract for the effects of aging of the oscillator. The frequency deviation can be determined even if the reference signal is of a center frequency susceptible to being offset from a nominal center frequency beyond an allowable amount within a limited time period.

28 Claims, 10 Drawing Sheets

CIRCUITRY AND METHOD FOR DETECTING FREQUENCY DEVIATION CAUSED BY AGING OF AN OSCILLATOR

The present invention relates generally to oscillating signal-generative circuitry. More particularly, the present invention relates to an apparatus, and an associated method, for detecting frequency deviation of a clock signal generated by an oscillator due to aging of the oscillator. Frequency deviation of the clock signal generated by the oscillator relative to a reference clock signal is measured. The measured frequency deviation includes frequency deviation contributions from different sources. The frequency deviation due to aging of the oscillator is estimated from the measured deviation.

In an embodiment in which the oscillator forms a portion of a radio base station, measurements of frequency deviation of the signal generated by the oscillator relative to a reference signal are taken. Frequency deviation due to aging of the oscillator is estimated from a set of measured values, even when the measured values include components of frequency deviation caused by the reference signal being subjected to holdover. Estimation of the frequency deviation due to aging of the oscillator permits the oscillator to be recalibrated automatically to counteract for such deviation.

BACKGROUND OF THE INVENTION

In a telecommunications system, a radio base station is used for transmitting information to a mobile station and for receiving information from a mobile station. The information transmitted or received is modulated onto a carrier signal. A carrier signal is a signal of a specific nominal frequency upon which one or more channels for communicating information between a base station and one or more mobile stations are defined. Other channels are defined at other carrier signals of other nominal frequencies. For a mobile to be able to receive information transmitted on a channel, it is important that the base station transmits at the expected frequency. For the base station to be able to receive information transmitted from a mobile over a channel of a specific carrier frequency, it must receive at the expected frequency. Also, for the different channels not to disturb each other, it is important that the carrier frequencies do not deviate from their center frequencies by more than a tolerable amount.

According to the IS-54 air interface standard, the center frequency of a carrier signal generated by a base station is required to vary by at most 0.25 ppm.

Carrier signals may be generated in a synthesizer module in the radio base station. To meet the stability requirements according to e.g., IS-54, an oscillator of high stability regarding the amount of variance, or drift, of center frequency of the generated oscillating signal can be used as a synthesizer reference from which the carrier signals are synthesized. The key issue is how to make this synthesizer reference stable enough. A synthesizer module synthesizes carrier signals of selected frequencies. Because the oscillating signal generated by the oscillator forms the synthesizer reference, the stability of the carrier signal is dependent upon the stability of the oscillator.

One way to provide a synthesizer reference used in today's systems is to use an oscillator in a free-wheeling (or free-running) mode. However, such a solution has several disadvantages. Either the oscillator (Rubidium) becomes very expensive, power-consumptive, large and heavy and operable in a limited temperature range, or the oscillator (OCXO) is susceptible to aging, which means that it has to be calibrated regularly (manually, unless a stable reference can be provided).

Figure 1:
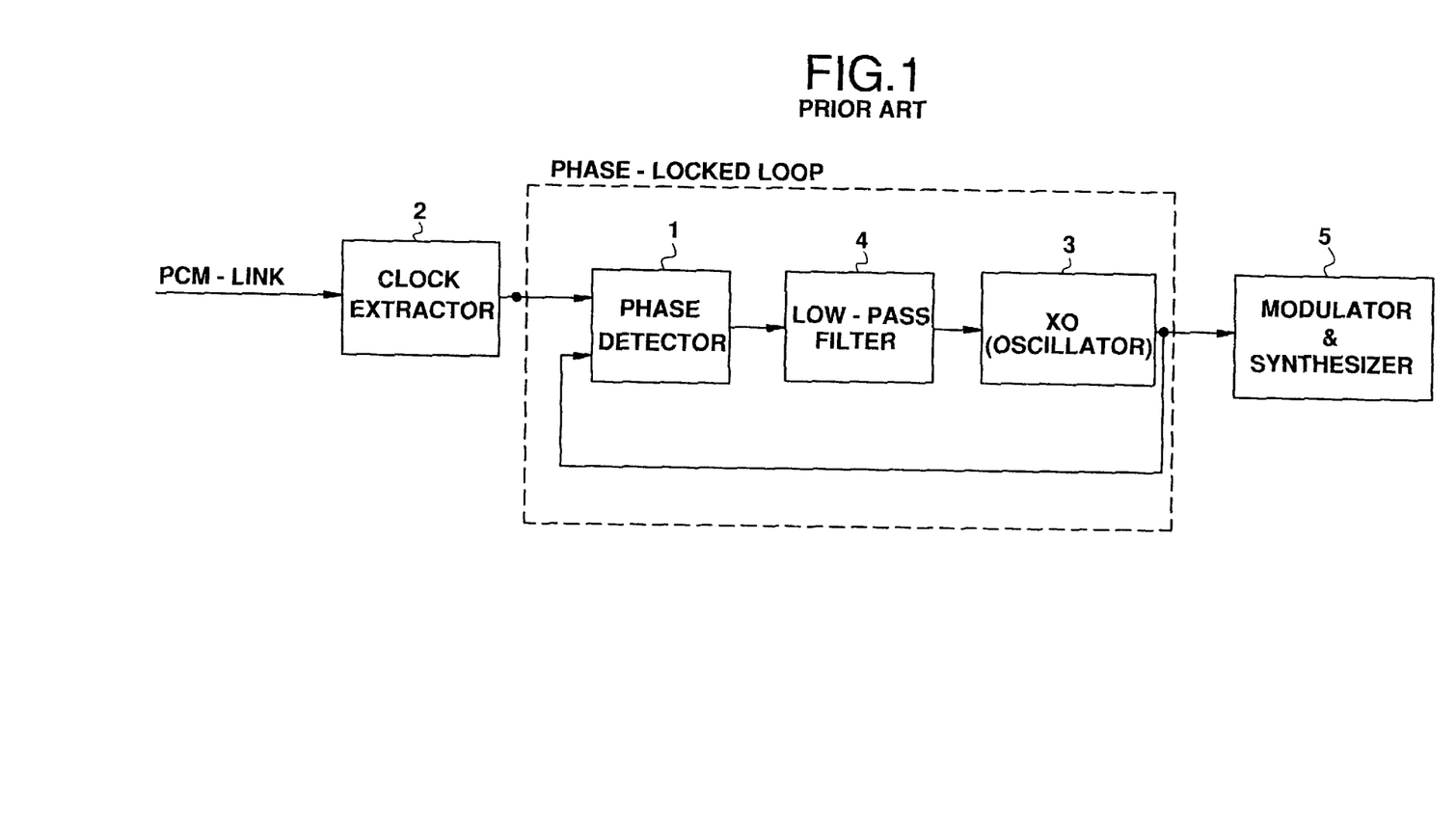
FIG. 1 illustrates a functional block diagram of a conventional phase-locked loop circuit forming a portion of a communication device.

Another existing solution is to lock the oscillator in a phase lock relationship to a long-term stable reference clock signal, as shown in FIG. 1. In FIG. 1, a PCM link clock signal is fed into a phase detector 1 of an ordinary phase-locked loop by way of a clock extractor 2. The phase detector detects differences in phase between the PCM link clock signal and an output signal generated by an oscillator 3 in a feedback connection. An output of the phase detector is fed into a low pass filter 4 which filters low-frequency components of the output of the phase detector provided thereto. The filter output formed by the filter is fed into the oscillator 3 as a reference clock signal from which the oscillator generates the output signal which is then used as a synthesizer reference clock signal by a radio part, here represented by a modulator and synthesizer 5. As noted above, the output signal is also fed back into the phase detector 1 in a feedback connection.

This solution used in some conventional systems, avoids the need for calibrating the oscillator for aging, by designing it to run phase locked to a long-term stable reference clock signal. The reference clock signal can be extracted from a long-term stable clock signal distributed on the PCM link which is used for transmission of information between the base station and a mobile switching center (MSC) in the mobile network. This signal is susceptible to jitter and wander, and holdover.

The long-term stable clock signal provided on the PCM link is generated in a signal chain from, for example, an atomic clock. Holdover occurs when the signal chain between the atomic clock signal and the long-term stable clock signal on the PCM link is broken, for example because of a restart in a switch (e.g., an MSC) in the chain. When this happens the center frequency of the PCM link clock signal may deviate from a nominal center frequency by some amount. Note that this means that although the signal chain is broken for a period pf time, the PCM link clock signal is still present, but may be out of range. Holdover occurs during relatively short periods (e.g., less than typically one hour).

Figure 2:
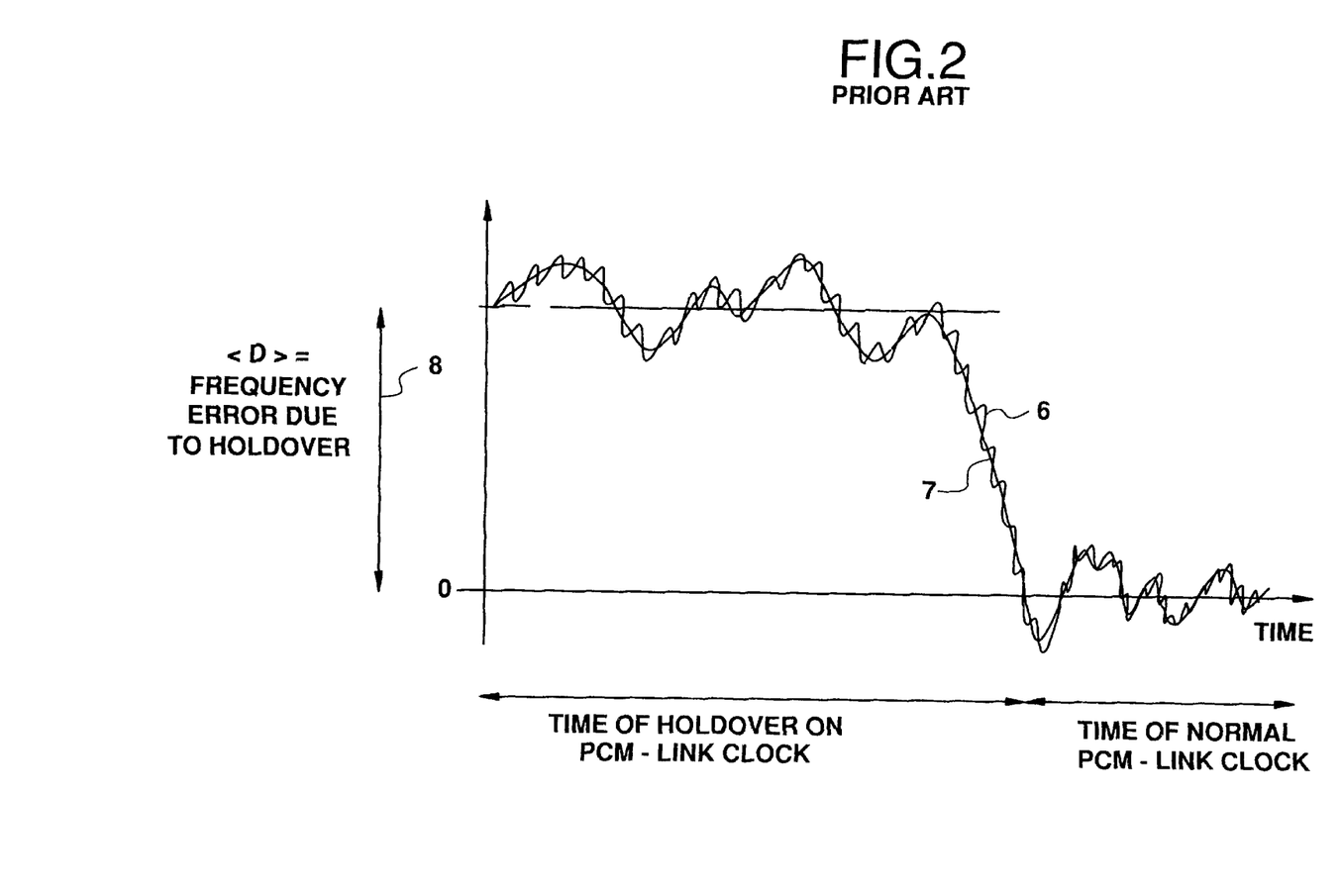
FIG. 2 graphically illustrates a frequency of a PCM clock signal which exhibits various components of frequency error.

In FIG. 2, a PCM link clock signal subjected to jitter 6 (>1 Hz), wander 7 (<1 Hz) and holdover 8 is shown. <D> indicates the center frequency deviation due to holdover 8.

Figure 3:
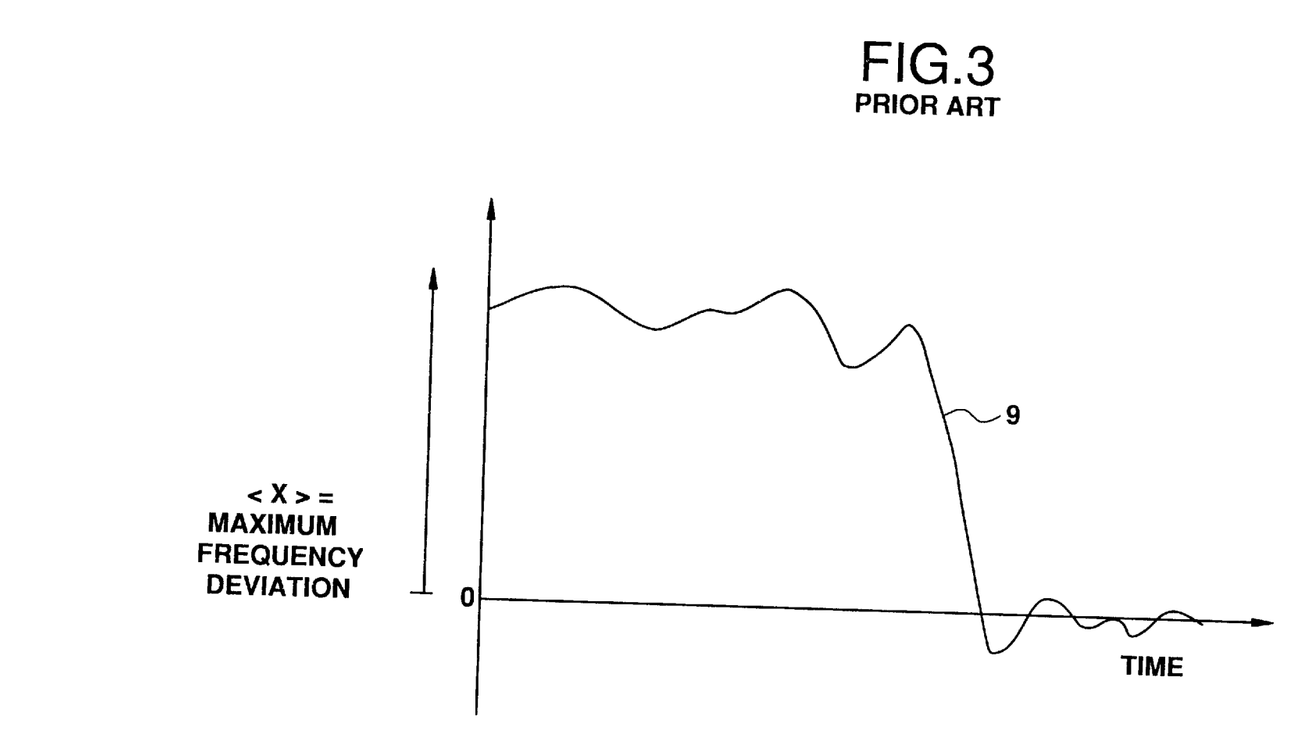
FIG. 3 graphically illustrates the clock frequency generated by an oscillator of a conventional phase-locked loop circuit when a PCM clock signal applied thereto includes components of frequency error, such as those shown in FIG. 2.

When running phase-locked to such a signal, the conventional phase-locked loop will generate an output signal 9 (to be used as a synthesizer reference signal) as shown in FIG. 3. Therein it can be seen that a certain influence from wander and holdover occurring on the PCM link is propagated through the phase-locked loop. <x> denotes the maximum deviation in frequency of the synthesizer reference signal, which is required to stay within certain limits (0.25 ppm for IS-54) for the stability requirement of the air interface standard to be fulfilled.

The quality of the clock signal is measured in Stratum levels. The Stratum level of a PCM link clock specifies maximal allowed frequency deviation due to holdover. To ensure that the stability requirement 0.25 ppm (which is of the order $10^{-7}$) for the carrier frequency is not violated (which means that <x> in FIG. 3 must be less than 0.25 ppm), the frequency deviation of the reference clock must also stay within these limits. This is true for a PCM link clock of Stratum-2 level (or less), for which frequency deviation due to holdover (<D> in FIG. 2) stays within 1.8 $10^{-8}$. However, such a link is expensive. It would be desirable to use a cheaper link of quality Stratum-3 (or even Stratum-4).

For links (clocks) of Stratum-3 level or worse, frequency deviation during holdover mode (<D> in FIG. 2) does not stay within the required limits as the frequency deviation <D> in this case is only required to stay within $4.6 \times 10^{-6}$ ppm.

SUMMARY OF THE INVENTION

It would be advantageous, therefore, to provide a manner by which an OCXO can be used as a synthesizer reference in a radio base station which is calibrated using a clock link of e.g., a Stratum-3 level or worse quality, thus avoiding that the OCXO be manually recalibrated.

It is accordingly an object of the present invention to use an oscillator which is temperature stable enough to be free running (free-wheeling) but which may be susceptible to aging (e.g., an OCXO) to generate carrier frequency for radio transmission.

It is another object of the present invention to let the free-wheeling OCXO generate the synthesizer reference, but to calibrate the OCXO periodically without manual intervention, e.g., once a month, for aging, e.g., using a Stratum-3 clock signal as a reference to detect frequency deviation.

During operation of an embodiment of the present invention, values of frequency deviation are measured and stored regularly during a period from one calibration to a next calibration. The measurements are performed in a way that minimizes the influence of jitter and wander on the PCM link (reference clock) and the influence of temperature variations on the OCXO. Measurement values of frequency deviation taken when the PCM link (reference clock) is in holdover mode are identified and disregarded. And, a resulting mean value of frequency deviation is interpreted as the aging contribution for the calibration interval and the OCXO is calibrated for aging.

DETAILED DESCRIPTION

Operation of the present invention shall be described with respect to specific embodiments in which the invention is embodied in a cellular communication system. It should be understood that the present invention can be alternately embodied in other devices and apparatus and that the following description is exemplary in nature. Additionally, although, for illustration purposes, the present invention has been described with reference to a system working according to the requirements of the IS-54 air interface standard, the invention is also applicable to systems working according to other standards, e.g., IS-136, GSM or PDC. However, for these standards, the stability requirements on the center frequency of the carrier signals may be different. Also, because the stability requirements may be different, it may be that for such a standard—assuming a more rigid stability requirement—the invention applies to allow use of a Stratum-2 quality level reference clock signal although for the case of a system working according to the IS-54 standard it would not be needed, as described with reference to FIG. 1, noted above.

The invention allows use of a clock link of any Stratum quality level, for stability requirements according to any air interface standard. The limiting factor for the fulfillment of stability requirements for carrier signals is the temperature stability of the OCXO.

Figure 4:
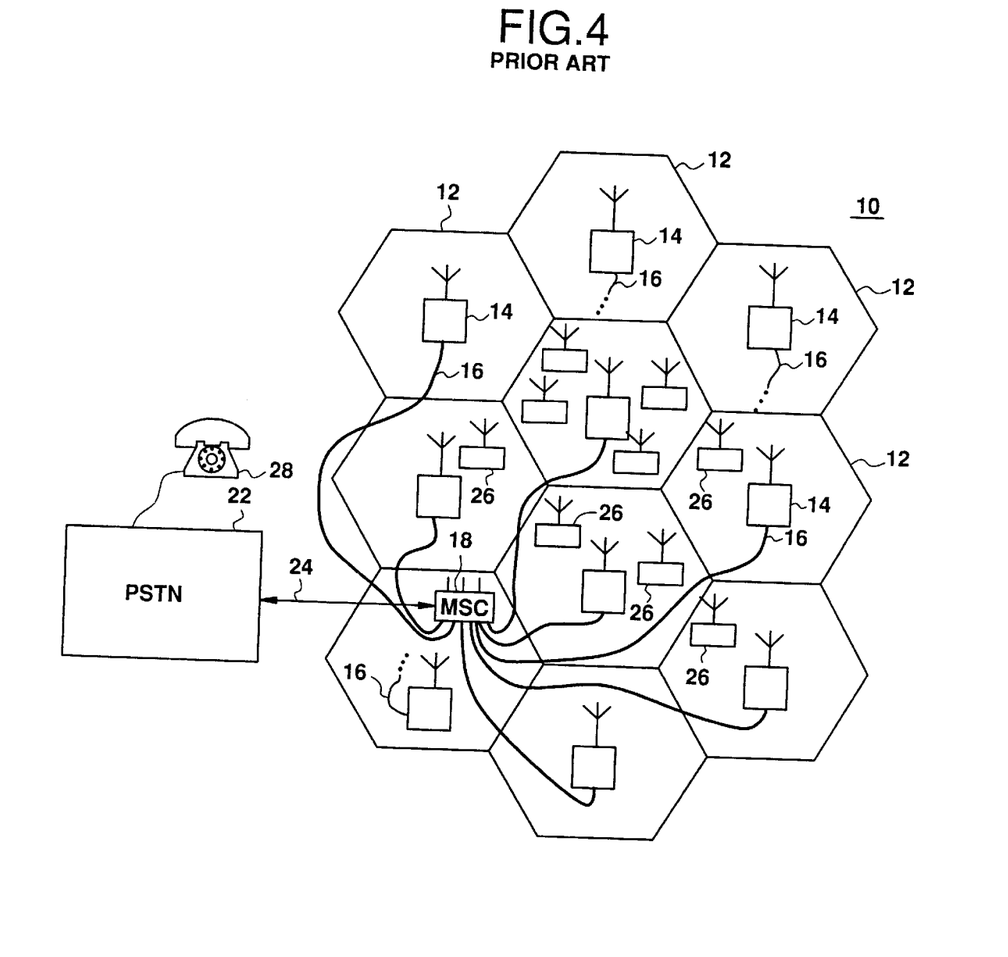
FIG. 4 illustrates a functional block diagram of a cellular communication system of which the circuit and method of an embodiment of the present invention may form a portion.

Referring to FIG. 4, an exemplary cellular communication system, shown generally at 10, includes a plurality of cells 12 defined about a geographical area. The cells 12 are each defined by a radio base station 14.

The base stations 14 are each coupled, by way of lines 16, to a mobile switching center (MSC) 18. The PCM links provided to the base stations 14 are formed on the lines 16. The MSC 18 is coupled to a public switched telephone network (PSTN) 22, here by way of lines 24.

Telephonic communication between a subscriber positioned at a subscriber unit (the "calling station"), such as the fixed-station, conventional, wire-line subscriber unit 28, and a selected mobile subscriber unit 26 positioned at any location within the geographical area encompassed by the cellular communication system 10 is permitted in conventional manner.

As noted previously, stability requirements for the center frequency of a carrier signal generated by a base station are set forth in, e.g., the IS-54 air interface standard promulgated by the EIA/TIA.

Operation of an embodiment of the present invention permits the stability requirements for the center frequency of the carrier signal to be met with a radio base station having an OCXO which is susceptible to aging but which can be calibrated automatically, without manual intervention.

Figure 5:
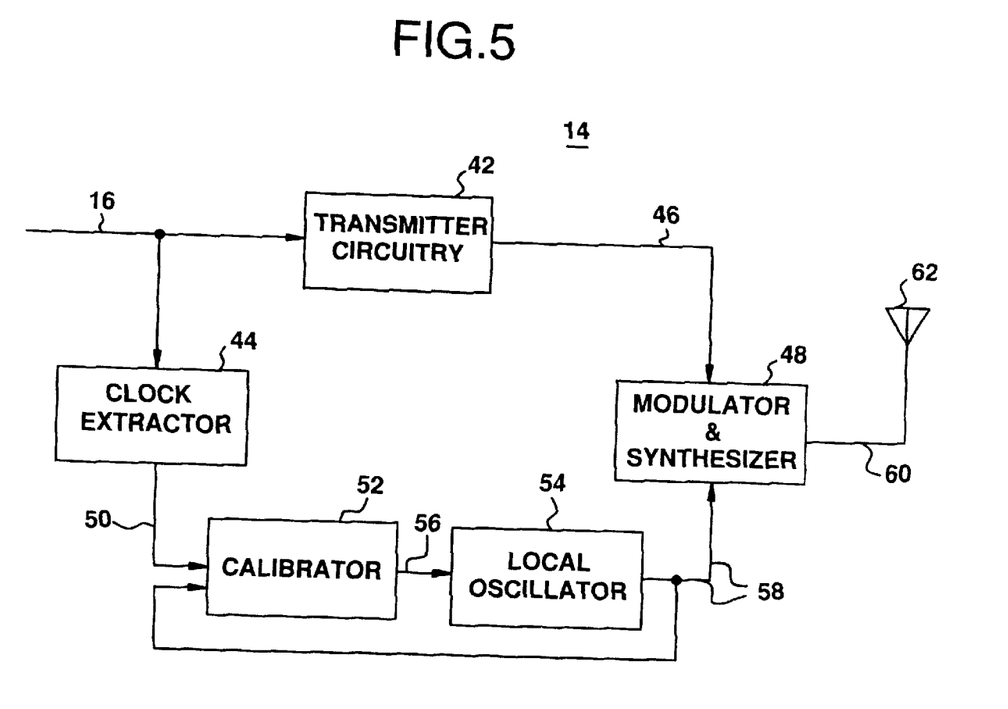
FIG. 5 is a functional block diagram of a radio base station which includes the circuitry of an embodiment of the present invention.

FIG. 5 illustrates functionally portions of the transmitter side of a radio base station 14 in which an embodiment of the present invention is operable. The radio base station 14 is here shown to be connected to the MSC 18 (shown in FIG. 4) via a PCM link 16. Line 16 is coupled to transmitter circuitry 42 and to a clock-extractor 44.

The transmitter circuitry 42 is operable in conventional manner to receive data generated on the line 16 and to convert such data into a form on line 46 to be modulated onto a carrier signal by a modulator and synthesizer 48.

The clock-extractor 44 forms a reference clock signal on line 50 responsive to a clock signal provided thereto on the PCM link 16. Because the signal transmitted on the PCM link supplied on line 16 is subject to, inter alia, jitter and wander, the reference clock signal formed by the clock-extractor 44 is of frequency characteristics which also exhibit jitter and wander.

The reference clock signal generated on the line 50 forms a first input to a calibrator 52. In one embodiment of the present invention, the calibrator 52 includes processing circuitry capable of executing algorithms to effectuate operation of the calibrator 52.

The calibrator 52 is coupled to a local oscillator 54 by way of line 56. The local oscillator 54 is formed of an OCXO. The local oscillator 54 generates a clock signal on line 58. The line 58 is coupled to the modulator and synthesizer 48 and also, in a feedback arrangement, to a second input to the calibrator 52.

The signal generated on line 56 by the calibrator 52 forms a tuning voltage which, when applied to the OCXO forming the local oscillator 54, tunes the oscillator.

As shall be described in greater detail below, the calibrator 52 compares characteristics of the reference clock signal supplied on line 50 with characteristics of the signal 58 generated by the local oscillator 54. Responsive to such comparisons, the calibrator 52 determines the value of the tuning voltage to be generated by the calibrator 52 on line 56.

The clock signal generated on line 58 is provided as a synthesizer reference signal to the modulator and synthesizer 48.

The modulator and synthesizer 48 modulates the signals generated by the transmitter circuitry 42 on the line 46 onto a carrier signal and outputs the modulated signal on line 60 which extends to an antenna 62. The modulated signal is transmitted by the antenna to a subscriber unit 26 (shown in FIG. 4).

Figure 6:
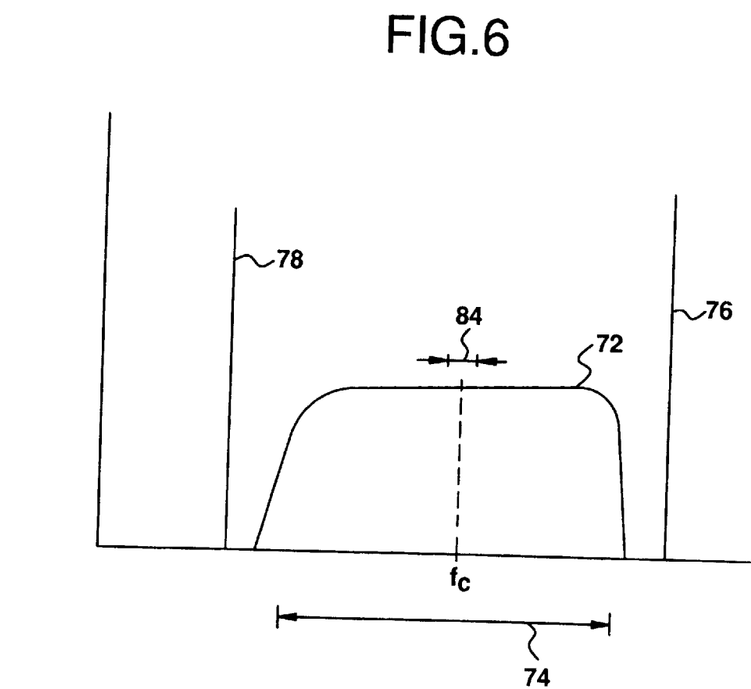
FIG. 6 is a graphical representation of a modulated signal generated by the radio base station shown in FIG. 5 and transmitted upon a radio transmission channel.

The graphical representation of FIG. 6 illustrates a modulated signal 72 generated by the base station 14 shown in FIG. 5. The magnitude of the modulated signal is plotted as a function of frequency. The modulated signal 72 is characterized by a center frequency, $f_c$, and is of a bandwidth indicated by the line segment 74.

The modulated signal 72 is transmitted upon a radio transmission channel defined by upper and lower channel frequencies, here represented by the lines 76 and 78, respectively. The IS-54 air interface standard sets forth the allowable deviation of the center frequency of the signals transmitted by the base station to ensure that the transmitted signal is within the appropriate radio transmission channel.

In the illustrated embodiment, the allowable frequency deviation of the center frequency of the signal 72 is indicated by the line segment 84. Upward or downward frequency deviation of the center frequency of the signal 72 within the frequency range defined by the segment 84 results in the bandwidth of the signal 72 still entirely within the radio frequency channel having upper and lower frequencies defined by lines 76 and 78. Frequency deviation of the center frequency of the signal 72 greater than that defined by the line segment 84 can result in interference between signal 72 and a signal transmitted upon an adjacent radio transmission channel.

Referring again to FIG. 5, the calibrator 52 is operative to tune the local oscillator 54 to ensure that the modulated signals generated by the modulator and synthesizer 48 of the base station 14 exhibit the frequency stability required by the appropriate cellular communication standard, such as the IS-54 air interface standard. By appropriately tuning the OCXO forming the local oscillator, the clock signal generated by the oscillator 54 is caused to be of a requisite stability. A clock signal of the requisite stability ensures that the modulated signal generated by the modulator and synthesizer 48 is also of a stability required by the appropriate cellular communication standard.

Figure 7:
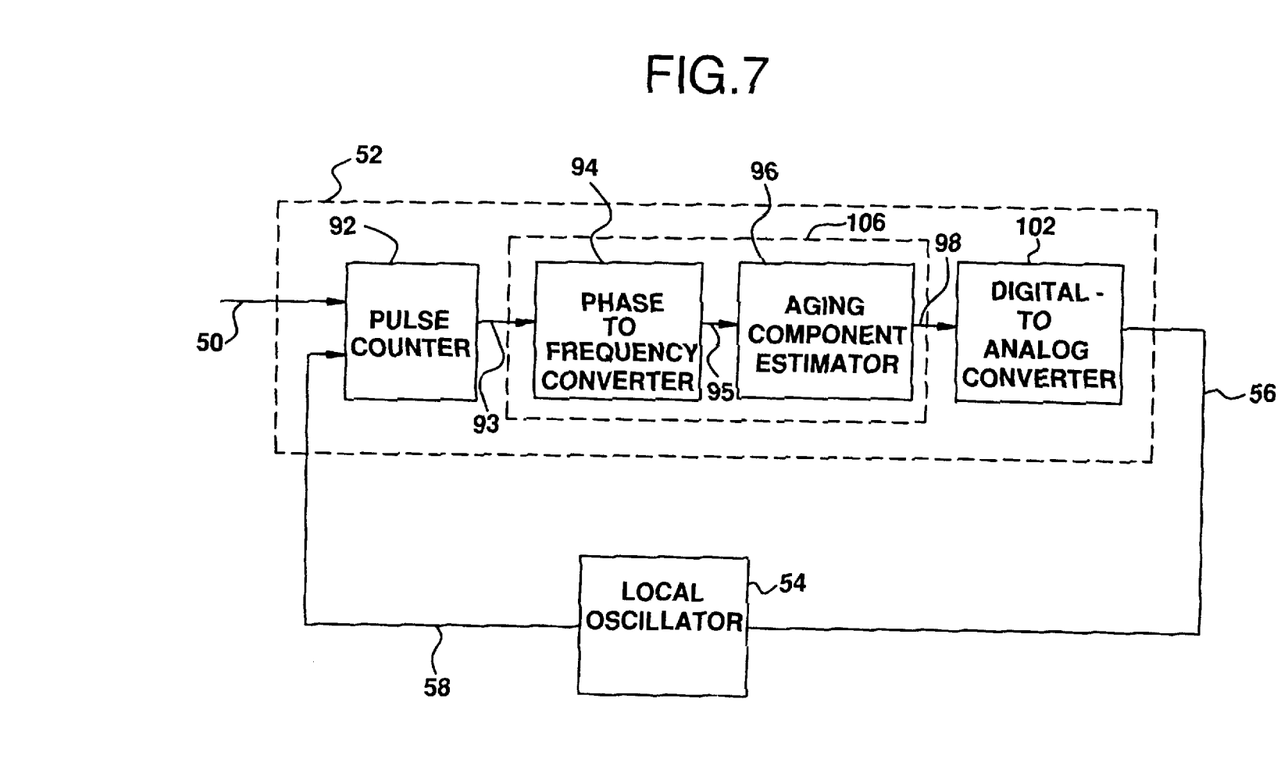
FIG. 7 is a functional block diagram of the circuitry of an embodiment of the present invention.

FIG. 7 illustrates the calibrator 52 coupled in a feed-back arrangement with the OCXO forming the local oscillator 54. In one embodiment, the OCXO 54 is formed of a Quarzkeramik 4005C-S19 oscillator, manufactured by Quarzkeramik GmbH of Stockdorf, Germany. The calibrator includes a pulse counter 92 coupled to receive the reference clock signal extracted by the clock-extractor 44 (shown in FIG. 5) on line 50 and to receive the clock signal generated by the oscillator 54 on the line 58. The pulse counter 92 is operative to determine phase differences, or deviations, between the reference clock signal and the clock signal generated on the lines 50 and 58, respectively.

Indications of the detected differences in phase between the reference clock signal and the clock signal are generated by the pulse counter on line 93 and supplied to a phase difference-to-frequency deviation converter 94. The converter 94 converts the phase differences determined by the count value of the pulse counter into frequency deviations. In one embodiment, the converter 94 is formed by algorithms executed by processing circuitry. Signals representative of the frequency deviations are generated on line 95 to be supplied to an aging component estimator 96.

The aging component estimator estimates the frequency deviation due to aging of the oscillator 54 from the total, detected frequency deviation.

To determine the amount of frequency deviation due to aging of the oscillator 54, the aging component estimator 96 estimates the component of frequency deviation due to aging of the oscillator from a set of measured total frequency deviations taken during a time interval and stored in the estimator 96.

While frequency deviation due to jitter and wander can momentarily be fairly significant, over time, the frequency deviation can be effectively removed if the measurement period is sufficiently large. Similarly, the frequency deviation due to temperature variations also has a statistical distribution having a mean value corresponding to the mean-time temperature of the surroundings of the OCXO when a series of measurements are made over a long period of time, at selected intervals spread out over, e.g., twenty-four hour periods.

Therefore, by appropriately selecting measuring periods during which the pulse counter 92 detects phase differences between the reference clock signal and the oscillator clock signal, frequency deviations caused by jitter and wander can be assumed to be minimized. Also, the effect of frequency deviation of the oscillator caused by temperature variations can be reduced. And, by not utilizing data obtained during measuring periods during which the reference clock signal (PCM-link) is in the holdover mode, the aging component estimator 96 is able to estimate the frequency deviation due to aging of the oscillator 54 from the total detected values of frequency deviation.

In one embodiment, only the mathematical difference between the reference clock signal and the oscillator clock signal is determined. The sources of error of the reference clock signal (i.e., short-term stability and holdover) are mixed with the error sources of the OCXO (i.e., temperature dependence and aging). The different sources of error behave differently from one another over time.

As shall be noted in greater detail below, each measurement is made for a selected time period, e.g., 100 seconds, to minimize errors caused by jitter and wander. The measurements (i.e., successive measurements) are repeated during a "long" period and spread out over 24 hours, also night and day, to calibrate for mean-time temperature. The successive measurements are spread out over a time period whose length is dependent on the aging specifications of the OCXO, combined with the requirements of the frequency correctness. Such time period, e.g., is of a length of approximately one month.

The aging component estimator 96 generates signals on line 98 of values responsive to the levels of detected frequency deviation due to aging of the oscillator 54. Line 98 is coupled to a converter, here a digital-to-analog converter 102 which converts the signals applied thereto into analog form, thereby to form a tuning voltage signal which is generated on line 56 for application to the oscillator 54.

In one embodiment of the invention, the aging component estimator 96 and the converter 94 are formed of processing circuitry having algorithms executable therein.

The block 106, shown in dash, positioned about the converter 94 and estimator 96 indicates that the functions of such elements can be performed by a common processor.

The processing circuitry, having algorithms executable therein, is further operative to cause appropriate exclusion of data obtained during periods in which the reference clock signal exhibits frequency disturbances beyond a selected amount, i.e., when the reference clock signal on the PCM-link is in holdover mode.

As mentioned previously, while the exemplary embodiments describe operation of the present invention with respect to a cellular communication system, the teachings of the present invention can be utilized any time in which an oscillator must be recalibrated to correct for frequency deviation caused by aging of the oscillator, and the reference signal, which might otherwise be used in a conventional phase-locked loop arrangement, is susceptible to short-term frequency deviation and frequency deviation behavior similar to holdover. The circuitry shown in FIG. 5 can form portions of many types of electronic devices which include a local oscillator, analogous to the oscillator 54.

Figure 8:
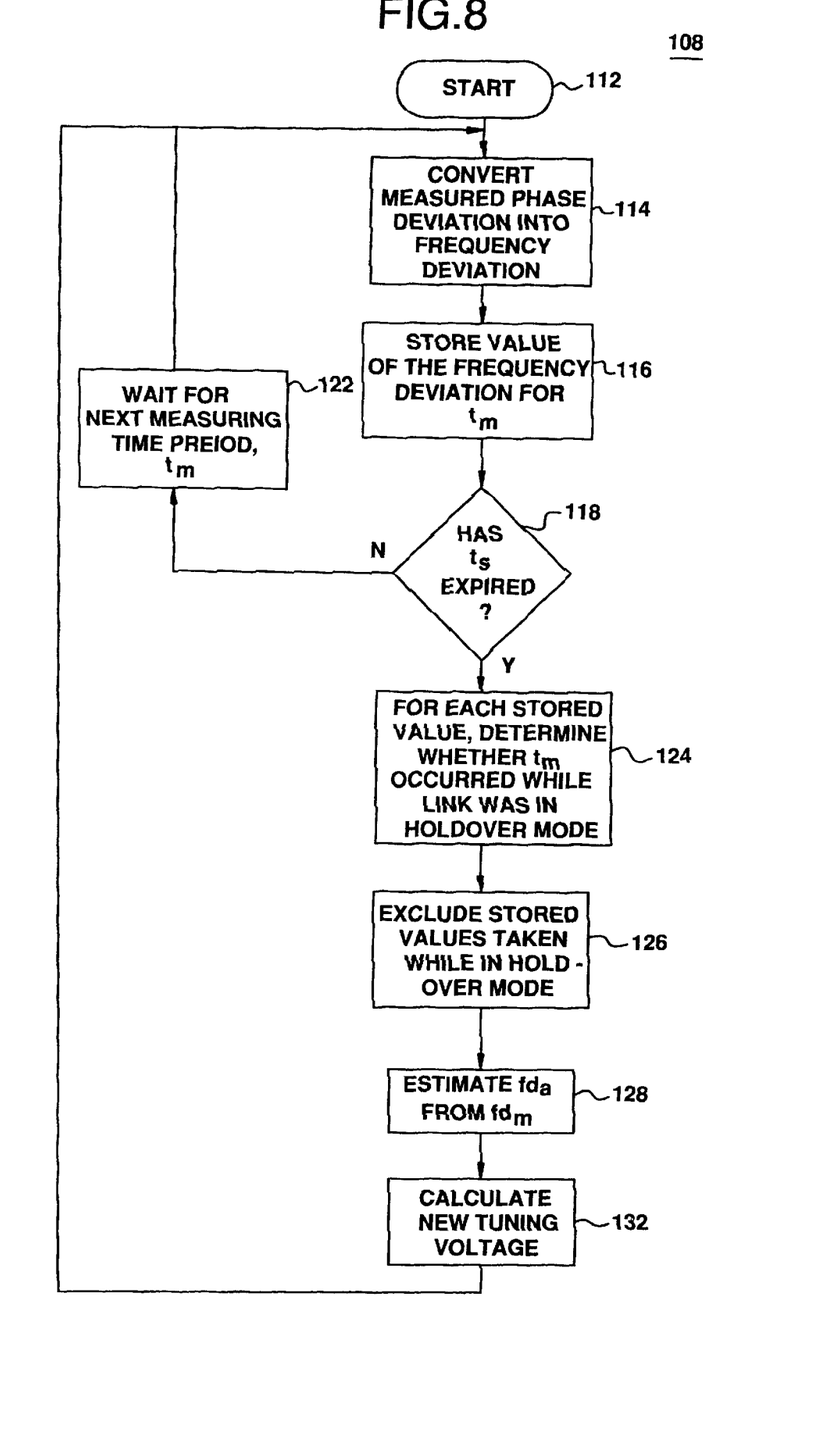
FIG. 8 is a logical flow diagram illustrating operation of portions of the circuitry shown in FIG. 7.

FIG. 8 illustrates a method, shown generally at 108, exemplary of operation of the aging component estimator 96 forming a portion of the calibrator 52 (shown in FIGS. 5 and 7).

When the aging component estimator is formed of processing circuitry having algorithms executable therein to perform the functions of the aging component estimator, the method 108 is embodied by algorithms executable by the processing circuitry.

Commencement of the method is indicated by the start block 112. Then, as indicated by the block 114, the frequency deviation between the reference clock signal and the oscillator clock signal generated by the oscillator 54 is determined by measuring phase difference and converting such measurements into frequency deviation. The phase difference measurement is based upon the measured phase difference between the clock signal of the local oscillator and the reference clock signal extracted from the PCM link clock signal.

The determinations are made during a measuring time period, $t_m$, of a selected length, such as 100 seconds. The measured value of frequency deviation, $fd_m$, includes components due not only to aging of the oscillator, but also due to jitter and wander, temperature variations, and frequency deviation measured in holdover mode. The measured value of frequency deviation may be described by the following sum:

$$fd_m = fd_a + fd_{jw} + fd_h$$

where:

$fd_a$ is the frequency deviation caused by aging of the oscillator;

$fd_{jw}$ is the frequency deviation caused by jitter and wander;

$fd_t$ is the frequency deviation caused by temperature variations; and $fd_h$ is the frequency deviation caused by the PCM-link clock signal being in a holdover mode.

By making recurring measurements over a long period of time, e.g. thirty days, and also at spaced intervals over twenty-four hours, frequency deviation caused by temperature variations can be centered around a value of the frequency deviation component due to temperature variations ($fd_t$) corresponding to the mean-time temperature of the surroundings of the OCXO. Thus, while in a single measurement frequency deviation due to temperature variation can not be distinguished from frequency deviation due to aging, measurements taken recurrently can decrease the effects of temperature variations.

Frequency deviation caused by the holdover mode of the PCM-link clock signal does not necessarily decrease over an extended measurement period. Such errors can be sorted out during operation of an embodiment of the present invention. As noted previously, a determination can be made of when the PCM-link is in the holdover mode. When such a determination is made (e.g., when excessive levels of frequency deviation of the PCM link are detected), measurements during this period can be ignored.

Next, and as indicated by the block 116, the value of the frequency deviation determined during the measuring time period is stored.

Thereafter, a determination is made, as indicated by the decision block 118, as to whether the time interval, $t_s$, during which the frequency deviation measurements are to be taken, has expired.

If not, the no branch is taken, and pause is made, as indicated by the block 122, to await a subsequent measuring time period. Thereafter, the frequency deviation for the subsequent measuring time period is determined. In one embodiment of the present invention, the time interval comprises a thirty day interval and four measuring periods occur during each day-and-night (viz., throughout each 24-hour period) of the thirty day time interval. The measuring periods, tm, may be evenly-spaced throughout each day-and-night of the time interval.

If the yes branch is taken from logic block 118, a determination is made, as indicated by the block 124, for each stored value of frequency deviation as to whether the measuring time period during which the data utilized to form the values of frequency deviations occurred when the PCM-link clock signal was in a holdover mode.

The stored values of frequency deviation taken during such measuring time periods are excluded from subsequent calculations of frequency deviation due to aging, $fd_a$, as indicated by the block 126. As noted previously, a time period during which the PCM-link clock signal is in a holdover mode is typically much less than a calibration time interval.

Thereafter, and as indicated by the block 128, the frequency deviation due to aging, $fd_a$, is estimated from the remaining, summed total of measured frequency deviations, $fd_m$, divided by the number of used measurements.

Then, and as indicated by the block 132, a new tuning voltage is calculated according to the following equation:

$$V_{new} = V_{old} - K \cdot fd_a$$

Where:

$V_{old}$ is the previous value of tuning voltage;

$V_{new}$ is a new tuning voltage;

K is a constant (the value of which is specified, e.g., in a data sheet listing characteristics of the OCXO); and $fd_a$ is the estimated value of frequency deviation due to aging.

Referring back to the block diagram of FIG. 7, once the new tuning voltage is calculated, a signal representative of the new tuning voltage is generated on the line 98. The signal is converted into analog form by the converter 102 and is thereafter applied to the oscillator 54 by way of the line 56. In this manner, the oscillator 54 is tuned to counteract for the effects of aging.

Figure 9A:
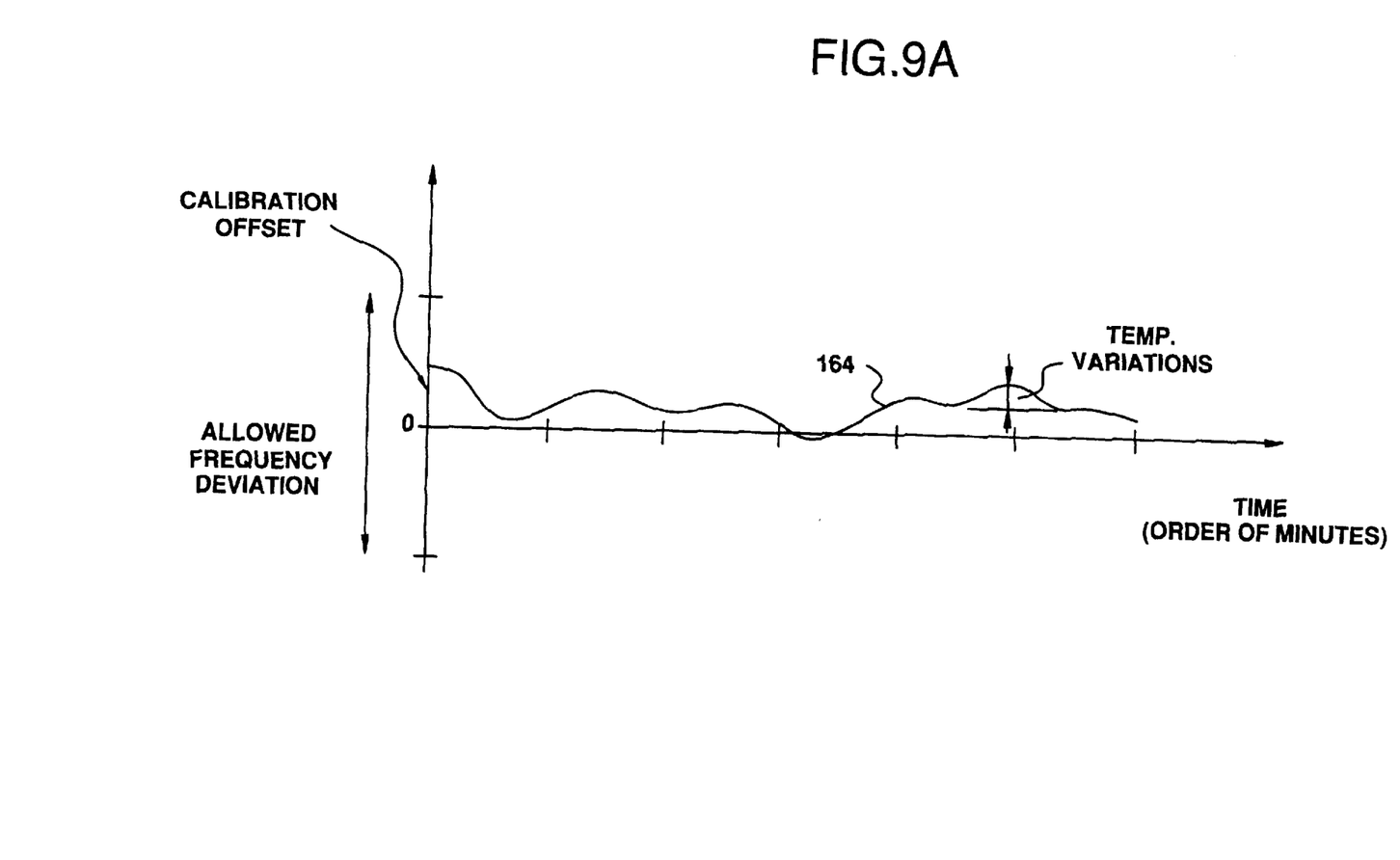
FIGS. 9A–B graphically illustrate frequency deviation of a clock signal generated by an oscillator according to an embodiment of the present invention.
Figure 9B:
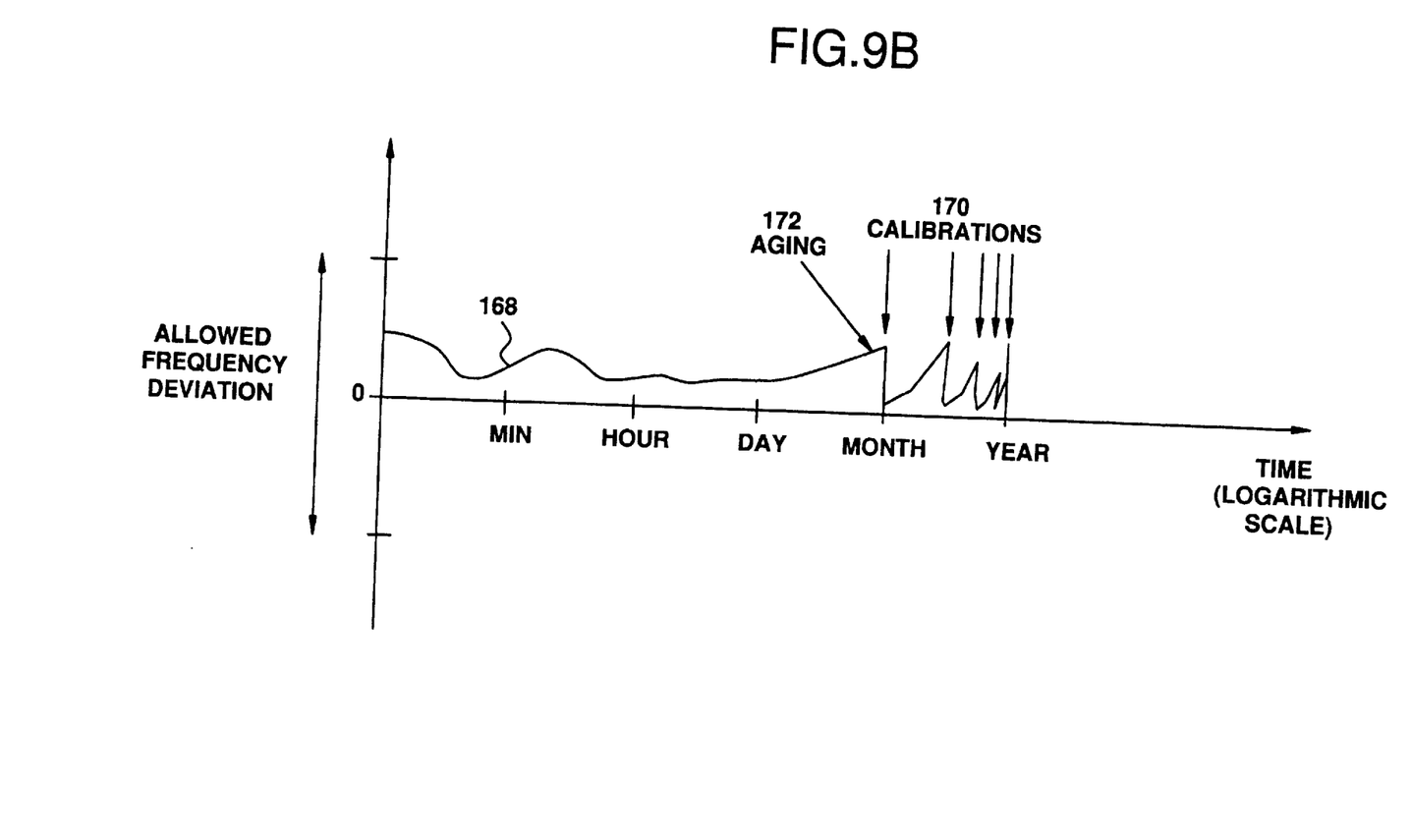

FIGS. 9A–B illustrate operation of an embodiment of the present invention in which a radio base station having an OCXO is coupled to receive a Stratum-3 quality level reference signal. The signals generated by the OCXO permit operation of the radio base station in conformance with the IS-54 air interface standard.

As the OCXO is freewheeling and calibrated at regular intervals for aging, such a stable synthesizer reference as required for the base station to be operated in accordance with the IS-54 standard is provided. Such performance is possible even though the reference clock signal used for the calibration of the OCXO is susceptible to short-term disturbances and holdover.

FIG. 9A illustrates a signal 164 generated by an oscillator coupled in a control loop operative pursuant to an embodiment of the present invention. Here, the operational requirements of the IS-54 air interface standard are met. While some offset from a nominal frequency is exhibited, such offset is within the allowable frequency deviation. Two components of frequency error are indicated in the figure—that of calibration offset (as the OCXO is not ideally calibrated for aging, and that of temperature variations. The components of frequency error caused by holdover and wander are not propagated through the control loop, as the OCXO is free-running.

The reference clock signal used for calibration may exhibit jitter, wander, and holdover as shown in FIG. 2.

FIG. 9B illustrates a curve 168 representing the long term frequency deviation from a nominal value of signals generated by the oscillator. Times at which the oscillator is recalibrated are represented in the Figure at times noted by the arrows 170 and the effects of aging are indicated by the arrow 172.

Through operation of an embodiment of the present invention, the air interface requirements set forth in the IS-54 air interface standard can be met by a radio base station utilizing an OCXO and coupled to receive a Stratum-3 quality level PCM link.

Through operation of the present invention, an OCXO forming the local oscillator 54 can be automatically recalibrated at periodic intervals to correct for frequency deviation of the oscillator due to aging of the oscillator. Such recalibration ensures that the modulated signals generated by the radio base station incorporating the calibrator 52 meet the frequency stability requirements of a cellular communication system of which the radio base station forms a portion.

Use of the present invention thereby obviates the maintenance heretofore periodically required to be performed upon an OCXO to correct for the effects of aging of the oscillator. Use of the present invention therefore permits an OCXO in a free-running mode to form a portion of a radio base station which complies with the frequency stability requirements for a cellular communication system without the need to manually recalibrate the OCXO. Use of the present invention can similarly permit an OCXO forming portions of other types of circuitry to be automatically tuned to overcome the effects of aging.

Presently-preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed:

1. A method of generating a stable synthesizer reference signal by a synthesizer reference signal source at a radio transmitter, the synthesizer reference signal susceptible to frequency deviation caused by aging of the synthesizer reference signal source, the radio transmitter coupled to a reference source which provides a reference clock signal, the reference clock signal being susceptible to center frequency deviation from a nominal center frequency deviation beyond an allowable amount, said method comprising the steps of:

determining deviations in phase between the synthesizer reference signal and the reference clock signal;

converting the deviations in phase into deviations in frequency;

estimating components of the deviations in the frequency determined during said step of converting caused by aging of the synthesizer reference signal source; and automatically calibrating the synthesizer reference signal source to counteract for the deviations in frequency of the synthesizer reference signal caused by aging of the synthesizer reference signal source, values of which are estimated during said step of estimating.

2. The method of claim 1 wherein estimations of the components of the deviations in frequency made during said step of estimating are made responsive to indications of the deviations in frequency which are within a selected level.

3. The method of claim 1 wherein estimations made during said step of estimating are made responsive to indications of the deviations in frequency determined at spaced-apart intervals during a selected time period.

4. The method of claim 3 wherein the selected time period is selected to be of a length in which mean frequency deviation caused by jitter and wander of the reference clock signal is of a substantially negligible level.

5. The method of claim 3 wherein the spaced-apart intervals at which the indications of the deviations in frequency are determined during said step of estimating are selected such that mean frequency deviation caused by temperature fluctuations substantially corresponds to a mean-time temperature.

6. Apparatus for generating a stable synthesizer reference signal by a synthesizer reference signal source at a radio-transmitter, the synthesizer reference signal susceptible to frequency deviation caused by aging of the synthesizer reference signal source, the radio transmitter coupled to a reference source which provides a reference clock signal, the reference clock signal being susceptible to center frequency deviation from a nominal center frequency beyond an allowable amount, said apparatus comprising:

a counter circuit, said counter circuit coupled to receive the reference clock signal generated by the reference source and the synthesizer reference signal, said counter circuit for determining phase differences between the reference clock signal and the synthesizer reference signal;

a phase difference-to-frequency deviation converter coupled to receive indications of the phase differences determined by said counter circuit, said converter for converting the phase differences into frequency deviations between the reference clock signal and the synthesizer reference signal;

an estimator coupled to receive indications of the deviations in frequency determined by said frequency-deviation determiner, said estimator for estimating components of the deviations in the frequency determined by said frequency-deviation determiner caused by aging of the synthesizer reference signal source; and a calibration signal generator coupled to receive indications of the deviations in frequency caused by aging of the synthesizer reference signal source estimated by said estimator, said calibration signal generator for generating a calibration signal for calibrating the synthesizer reference signal source to counteract for the deviations in frequency caused by aging of the synthesizer reference signal source.

7. In an oscillator circuit coupled to receive a reference signal of a center frequency susceptible to being offset from a nominal center frequency beyond an allowable amount within a selected time period, the oscillator circuit having an oscillator for generating a clock signal characterized by a clock frequency, an improvement of frequency deviation detecting apparatus for detecting frequency deviation of the clock frequency of the clock signal due to aging of the oscillator, said frequency deviation detecting apparatus comprising:

a counter circuit, said counter circuit coupled to receive the clock signal generated by the oscillator and the reference signal, said counter circuit for determining phase differences between pulses of the clock signal and pulses of the reference signal;

a phase difference-to-frequency deviation converter coupled to receive indications of the phase differences determined by said counter circuit, said converter for converting the phase differences into frequency deviations between the clock signal and the reference signal; and an aging component estimator coupled to receive indications of the deviations in frequency determined by said frequency deviation determining device, said aging component estimator for estimating components of the deviations in the clock frequency caused by aging of the oscillator, thereby to detect the frequency deviation of the clock signal due to the aging of the oscillator.

8. The frequency deviation detecting apparatus of claim 7 wherein said aging component estimator is further operative to generate a voltage signal, the voltage signal of values representative of estimations of the deviations in the clock frequency due to the aging of the oscillator.

9. The frequency deviation detecting apparatus of claim 8 wherein the voltage signal generated by said aging component estimator is utilized to form a calibration tuning signal for application to the oscillator to alter the clock frequency of the clock signal by amounts responsive to the values of the frequency deviation due to aging estimated by said aging component estimator.

10. The frequency deviation detecting apparatus of claim 9 further comprising a converter for converting the voltage signal generated by said aging component estimator into the calibration tuning signal.

11. The frequency deviation detecting apparatus of claim 10 wherein the voltage signal generated by said aging component estimator is formed of a digital value, wherein the calibration tuning signal is formed of an analog signal, and wherein said converter comprises a digital-to-analog converter.

12. The frequency deviation detecting apparatus of claim 7 wherein said phase difference-to-frequency deviation converter comprises a processor having algorithms executable therein for converting the phase differences into the frequency deviations.

13. The frequency deviation detecting apparatus of claim 7 wherein said aging component estimator comprises a processor having algorithms executable therein for estimating the components of the deviations in the clock frequency caused by aging of the oscillator.

14. The frequency deviation detecting apparatus of claim 7 wherein the oscillator forms a portion of a radio base station utilized in a cellular communications network and wherein said frequency deviation determining device and said aging component estimator form portions of the radio base station.

15. The frequency deviation detecting apparatus of claim 14 wherein the reference signal to which the deviations in frequency of the clock signal are measured by said frequency deviation determining device comprises the referencen signal generated by a frequency-controlled source of the cellular communication network.

16. The frequency deviation detecting apparatus of claim 15 wherein said aging component estimator further determines times in which the reference signal exhibits frequency disturbances beyond a selected amount.

17. The frequency deviation detecting apparatus of claim 7 wherein said frequency determining device measures the deviations in frequency during selected time periods during a selected time interval.

18. The frequency deviation detecting apparatus of claim 17 wherein said aging component estimator estimates the components of the deviations in the clock frequency caused by aging responsive to the indications of the deviations in frequency upon completion of the selected time interval.

19. The frequency deviation detecting apparatus of claim 7 wherein estimations of the components of the deviations in the clock frequency estimated by said aging component estimator are made responsive to indications of the deviations in frequency received at said aging component estimator which are within a selected level.

20. The frequency deviation detecting apparatus of claim 7 wherein estimations of the components of the deviations in the clock frequency estimated by said aging component estimator are made responsive to indications of the deviations in frequency received at said aging component estimator at spaced-apart intervals during a selected time period.

21. The frequency deviation detecting apparatus of claim 20 wherein the selected intervals at which the indications of the deviations in frequency are determined by said aging component estimator are selected such that mean frequency deviation caused by temperature fluctuations corresponds to a mean-time-temperature.

22. The frequency deviation detecting apparatus of claim 20 wherein said aging component estimator further comprises a memory device for storing values representative of the indications of the deviations in frequency received at the spaced-apart intervals during the selected time period.

23. The frequency deviation detecting apparatus of claim 20 wherein the selected time period is selected to be of a length in which mean frequency deviation caused by jitter and wander of the reference clock signal is of a substantially negligible level.

24. A method for detecting frequency deviation of a clock frequency of a clock signal generated by an oscillator due to aging of the oscillator, the oscillator coupled to receive a reference signal of a center frequency susceptible to being offset from a nominal center frequency beyond an allowable amount within a selected time period, said method comprising the steps of:

determining deviations in phase of the clock signal relative to the reference signal;

generating a deviation signal indicating the deviations in phase;

converting the deviations in phase indicated by the deviation signal to deviations in frequency;

estimating components of the deviations in the clock frequency of the clock signal caused by aging of the oscillator, thereby detecting the frequency deviation of the clock signal due to aging of the oscillator, wherein the step of estimating is responsive to the deviations in frequency determined during the step of converting; and outputting the detected deviation of the clock frequency of the clock signal.

25. Frequency deviation detecting apparatus for detecting frequency deviation of a clock frequency of a clock signal generated by an oscillator due to aging of the oscillator, the oscillator coupled to receive a reference signal of a center frequency susceptible to being offset from a nominal center frequency beyond an allowable amount within a selected time period, said frequency deviation detecting apparatus comprising:

means for determining deviations in phase of the clock signal relative to the reference signal;

means for generating a deviation signal indicating the deviations in phase;

means for converting the deviations in phase indicated by the deviation signal to deviations in frequency; and means for estimating components of the deviations in the clock frequency caused by aging of the oscillator, thereby detecting the frequency deviation of the clock signal due to aging of the oscillator, said means for estimating operative responsive to the deviations in frequency measured by said means for converting.

26. A frequency control circuit for tuning an oscillator to counteract for frequency deviation of a clock signal generated by the oscillator caused by aging of the oscillator, the oscillator coupled to receive a reference signal of a center frequency susceptible to being offset from a nominal center frequency beyond an allowable amount within a selected time period, said frequency control circuit comprising:

a phase difference measuring device for measuring differences in phase of the clock signal relative to the reference signal;

a phase difference-to-frequency deviation converter coupled to receive indications of the differences in phase measured by said phase difference measuring device, said converter for converting the differences in phase between the clock signal and the reference signal into frequency deviations;

an aging component estimator coupled to receive indications of the frequency deviations determined by said phase difference-to-frequency deviation converter, said aging component estimator for estimating components of the deviations in frequency of the clock signal caused by aging of the oscillator, thereby to detect the frequency deviation of the clock signal due to the aging of the oscillator; and a tuning signal generator for generating a tuning signal for application to the oscillator to tune the oscillator, said tuning signal generator coupled to said aging component estimator and said tuning signal of a value representative of the frequency deviation estimated by said aging component estimator.

27. The frequency control circuit of claim 26 wherein the oscillator forms a portion of a radio base station and wherein the reference signal relative to which said phase difference measuring device measures the differences comprises a PCM-link generated by a telephonic network.

28. The frequency control circuit of claim 26 wherein said aging component estimator comprises a processor having algorithms executable therein for estimating the components of the deviations in the clock frequency caused by aging of the oscillator.

* * * * *

UNITED STATES PATENT AND TRADEMARK OFFICE
CERTIFICATE OF CORRECTION

PATENT NO. : 5,881,374
DATED : March 9, 1999
INVENTOR(S) : Österberg

It is certified that error appears in the above-identified patent and that said Letters Patent is hereby corrected as shown below:

On the Title Page, Item

[21], Appl. No.          Replace "792,665"
                         With --08/792,665--

[56], line 5             Replace "11/1971"
                         With --5/1972--

Attorney, Agent, or Firm
                         After "Gilchrist"
                         Insert --,P.C.--

Column 8, line 1         Replace " $fd_m=fd_a+fd_{jw}+fd_h$ "
                         With -- $fd_m=fd_a+fd_{jw}+fd_t+fd_h$ --

Column 12, lines 24-25   Replace "referencen"
                         With --reference--

Signed and Sealed this

Eighth Day of May, 2001

Attest:

Attesting Officer

NICHOLAS P. GODICI

Acting Director of the United States Patent and Trademark Office